United States Patent
Lin et al.

(10) Patent No.: US 6,573,555 B1
(45) Date of Patent: Jun. 3, 2003

(54) SOURCE SIDE INJECTION PROGRAMMING AND TIP ERASING P-CHANNEL SPLIT GATE FLASH MEMORY CELL

(75) Inventors: Yai-Fen Lin, Chung Hsing Village (TW); Di-Son Kuo, Hsinchu (TW); Hung-Cheng Sung, Hsin-Chu (TW); Chia-Ta Hsieh, Tainan (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 153 days.

(21) Appl. No.: 09/587,464

(22) Filed: Jun. 5, 2000

Related U.S. Application Data

(62) Division of application No. 09/298,142, filed on Apr. 23, 1999, now Pat. No. 6,093,608.

(51) Int. Cl.⁷ .............................. H01L 29/788
(52) U.S. Cl. ................ 257/315; 257/317; 257/320; 257/321
(58) Field of Search ............... 438/257, 258, 438/259, 260, 261, 262, 263, 264, 265, 266; 257/322, 326, 316, 317, 314, 315, 320, 321, 390

(56) References Cited

U.S. PATENT DOCUMENTS

| | | | |
|---|---|---|---|
| 5,045,488 A | * | 9/1991 | Yeh .............................. 257/317 |
| 5,067,108 A | | 11/1991 | Jenq ............................ 365/185 |
| 5,480,821 A | | 1/1996 | Chang .......................... 437/43 |
| 5,652,161 A | | 7/1997 | Ahn .............................. 437/43 |
| 5,706,227 A | | 1/1998 | Chang et al. ........... 365/185.18 |
| 6,074,916 A | * | 6/2000 | Cappelletti |
| 6,087,695 A | * | 7/2000 | Chen |

* cited by examiner

Primary Examiner—Minh Loan Tran
(74) Attorney, Agent, or Firm—George O. Saile; Stephen B. Ackerman; Larry J Prescott

(57) ABSTRACT

A split gate P-channel flash memory cell and method of forming a split gate P-channel flash memory cell which avoids of high erasing voltage, reverse tunneling during programming, drain disturb and over erase problems, and permits shrinking the cell dimensions. The control gate has a concave top surface which intersects with the sidewalls to form a sharp edge. The cell is programmed by charging the floating gate with electrons by means of hot electron injection from the channel into the floating gate. The cell is erased by discharging the excess electrons from the floating gate into the control gate using Fowler-Nordheim tunneling. The sharp edge at the intersection of the concave top surface and the sidewalls of the floating gate produces a high electric field between the control gate and the floating gate to accomplish the Fowler-Nordheim tunneling with only moderate voltage differences between the floating gate and control gate. The P-channel flash memory cell has a higher impact ionization rage for creating hot electrons so that the distance between the source and drain junctions and the length of the floating gate can be kept small thereby permitting the dimensions of the flash memory cell to be shrunk.

10 Claims, 4 Drawing Sheets

SOURCE SIDE INJECTION PROGRAMMING AND TIP ERASING P-CHANNEL SPLIT GATE FLASH MEMORY CELL

This is a division of patent application Ser. No. 09/298, 142, filing date Apr. 23, 1999, Source Side Injection Programming And Tip Erasing P-Channel Split Gate Flash Memory Cell, assigned to the same assignee as the present invention, now U.S. Pat. No. 6,093,608.

BACKGROUND OF THE INVENTION (1) Field of the Invention

This invention relates to a flash memory cell and more particularly to a P-channel flash memory cell using source side injection hot electron tunneling for programming the cell, and a sharp edge on the control gate and Fowler-Nordheim tunneling for erasing the cell.

(2) Description of the Related Art

U.S. Pat. No. 5,706,227 to Chang et al. describes a split gate P-channel flash memory cell which uses electron tunneling from the floating gate into the N-well for erasing the cell.

U.S. Pat. No. 5,480,821 to Chang describes source coupled N-channel split gate flash memory cells.

U.S. Pat. No. 5,067,108 to Jenq describes a flash memory cell using hot electron injection into the floating gate to program the cell and Fowler-Nordheim tunneling of electrons from the floating gate to the control gate to erase the cell.

U.S. Pat. No. 5,652,161 to Ahn describes a method of forming a split gate flash EEPROM cell.

SUMMARY OF THE INVENTION

Flash memory cells are find frequent use in electrically programmable read only memory cells. N-channel flash memory cells however have a problem of reverse tunneling affecting unselected cells due to the bias voltages applied during programming of selected cells. Nitride spacers are frequently required to avoid this problem of reverse tunneling. P-channel flash memory cells using a double polysilicon split gate have a disadvantage of requiring a high erasing voltage and thin tunnel oxide. P-channel stacked gate flash memory cells suffer from drain disturb problems and over-erase problems. The ability to shrink N-channel flash memory cells is limited by the distance required between the source and drain junctions and the required length of the floating gate in order to create sufficient hot electrons to program the cell.

It is a principle objective of this invention to provide a method of forming a split gate P-channel flash memory cell which avoids these problems of high erasing voltage, reverse tunneling during programming, drain disturb and over erase problems, and permits shrinking the cell dimensions.

It is another principle objective of this invention to provide a split gate P-channel flash memory cell which avoids these problems of high erasing voltage, reverse tunneling during programming, drain disturb and over erase problems, and permits shrinking the cell dimensions.

These objectives are achieved by using a P-channel polysilicon split gate flash memory cell. The P-channel split gate flash memory cell has a floating gate and a control gate and a sharp edge on the floating gate. The cell is programmed by charging the floating gate with electrons by means of hot electron injection from the channel into the floating gate. The cell is erased by discharging the excess electrons from the floating gate into the control gate using Fowler-Nordheim tunneling. The floating gate is fabricated with a concave top surface so that a sharp edge is formed at the intersection of the concave top surface and the sidewalls of the floating gate. The sharp edge produces a high electric field between the control gate and the floating gate to accomplish the Fowler-Nordheim tunneling with only moderate voltage differences between the floating gate and control gate.

The length of the floating gate can be kept small so that the flash memory cell can be shrunk to small dimensions.

DESCRIPTION OF THE PREFERRED EMBODIMENTS

Figure 1:
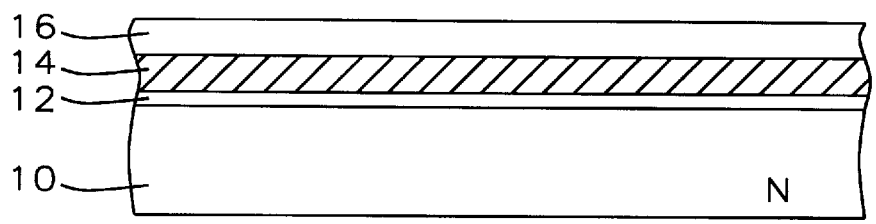
FIG. 1 shows a cross section view of an N-type silicon substrate having a layer of first oxide, a layer of first polysilicon, and a layer of silicon nitride formed thereon.

Refer now to FIGS. 1–9 for a preferred embodiment of a method of fabricating the P-channel flash memory cell of this invention. FIG. 1 shows a cross section view of a part of an N-type silicon substrate 10. A layer of first oxide 12, silicon oxide, having a thickness of between about 50 and 150 Angstroms is grown on the silicon substrate 10. A layer of first polysilicon 14, having a thickness of between about 1000 and 1400 Angstroms, is then deposited on the layer of first oxide 12. A layer of silicon nitride 16, having a thickness of between about 650 and 950 Angstroms, is then formed on the layer of first polysilicon 14.

Figure 2:
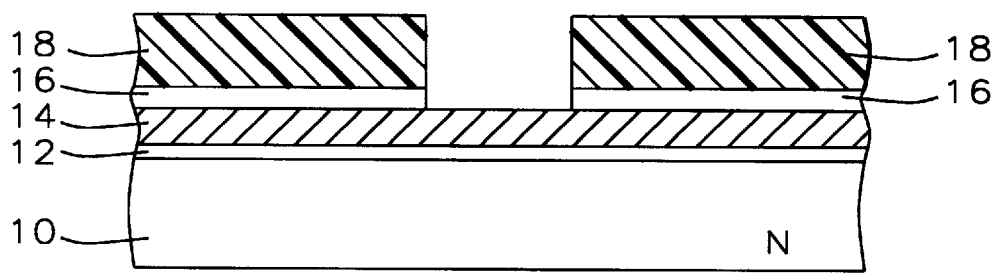
FIG. 2 shows a cross section view of the substrate of FIG. 1 with a patterned layer of first photoresist used to open a hole in the layer of silicon nitride.

Next, as shown in FIG. 2, a first layer of photoresist is formed on the layer of silicon nitride 16 and patterned using standard photolithographic techniques to form a first photoresist mask 18. The first photoresist mask 18 has an opening at the location where the floating gate will be formed. That part of the layer of silicon nitride 16 exposed by the first photoresist mask 18 is them etched away using conventional dry anisotropic etching techniques. The first photoresist mask 18 is then removed leaving the patterned layer of silicon nitride 16 having an opening at the location where the floating gate will be formed thereby exposing part of the layer of first polysilicon 14.

Figure 3:
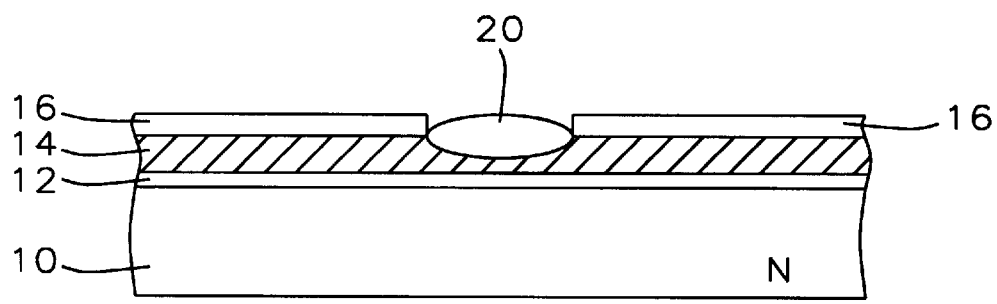
FIG. 3 shows a cross section view of the substrate of FIG. 2 after growing a silicon oxide cap through the opening in the layer of silicon nitride.
Figure 4:
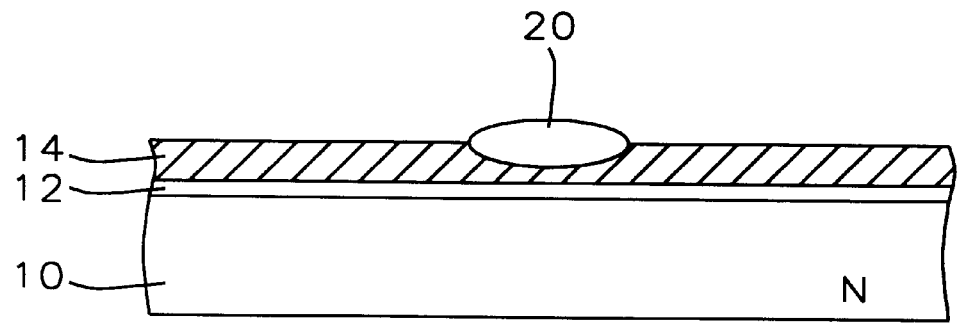
FIG. 4 shows a cross section view of the substrate of FIG. 3 after removing the layer of silicon nitride.
Figure 5:
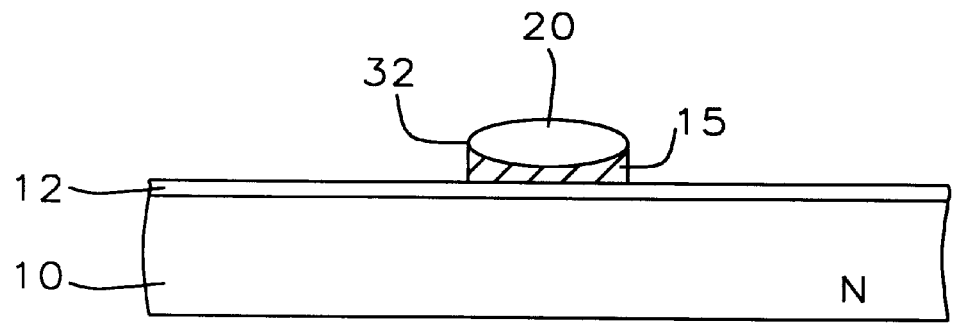
FIG. 5 shows a cross section view of the substrate of FIG. 4 after forming the floating gate using the silicon oxide cap as a mask to etch away excess polysilicon.

Next, as shown in FIG. 3, an oxide cap 20 is grown in that part of the layer of first polysilicon 14 exposed by the opening in the layer of silicon nitride 16. As shown in FIG. 3, the oxide cap 20 extends deeper into the polysilicon at the center of the opening in the layer of silicon nitride 16 than at the edge of the opening in the layer of silicon nitride 16. This oxide growth pattern is similar to the growth of oxide in the formation of field oxide isolation regions using the well known LOCOS process and leaves a depression in the top surface on that part of the layer of first polysilicon 14 under the oxide cap 20. As shown in FIG. 4 the patterned layer of silicon nitride is then etched away using conventional anisotropic dry etching. As shown in FIG. 5 that part of the layer of first polysilicon not covered by the oxide cap 20 is etched away, using conventional anisotropic dry etching and the oxide cap 20 as a mask, thereby forming a polysilicon floating gate 15. As shown in FIG. 5, the depression in the top surface of the floating gate and the sidewalls of the floating gate intersect to form a sharp edge 32 on the floating gate.

Figure 6:
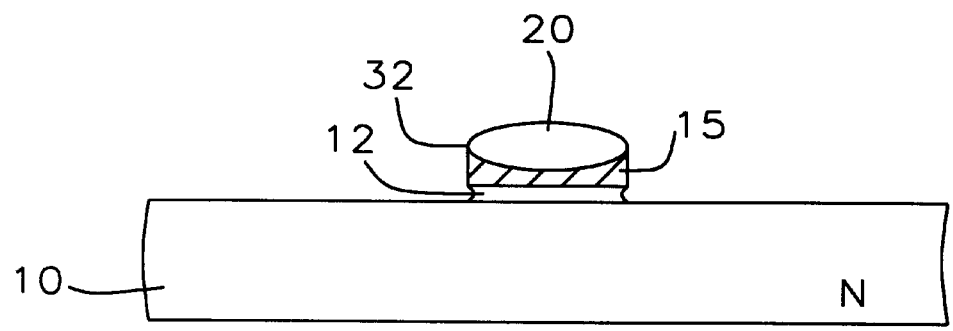
FIG. 6 shows a cross section view of the substrate of FIG. 5 after etching away that part of the silicon oxide not covered by the floating gate.
Figure 7:
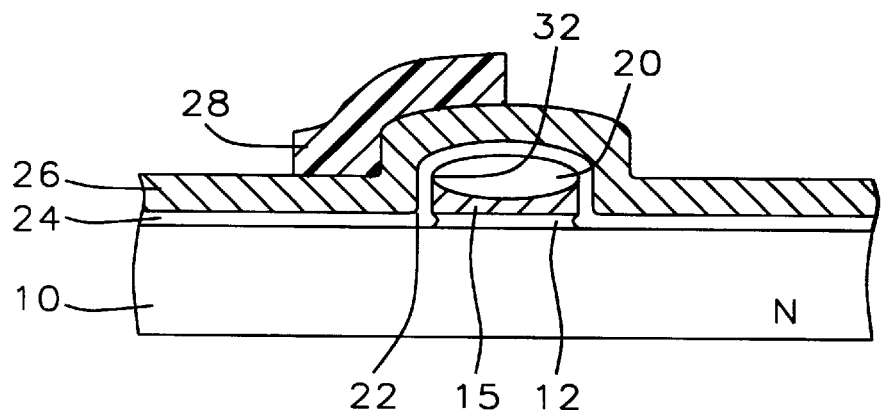
FIG. 7 shows a cross section view of the substrate of FIG. 6 after depositing a layer of second oxide and a layer of second polysilicon and forming a second photoresist mask.

Next, as shown in FIG. 6 that part of the layer of first oxide which is not under the floating gate is etched away, using wet etching and an etchant such as a 1% HF solution, As can be seen in FIG. 6 there is a slight undercutting of the layer of first oxide 12 under the floating gate which will have significance in later process steps. As shown in FIG. 7, a layer of second oxide 24 is then deposited on the wafer. The layer of second oxide 24 is silicon oxide having a thickness of between about 100 and 200 Angstroms. A layer of second polysilicon 26, having a thickness of between about 1500 and 2000 Angstroms, is then deposited on the layer of second oxide 24. The second polysilicon 24 can be doped or undoped polysilicon and can be deposited as polysilicon or can be deposited as amorphous silicon and recrystallized. As can be seen in FIG. 7, the slight undercutting of the first oxide 12 under the floating gate 15 causes a small protrusion 22 to form in the layer of second polysilicon 26.

Figure 8:
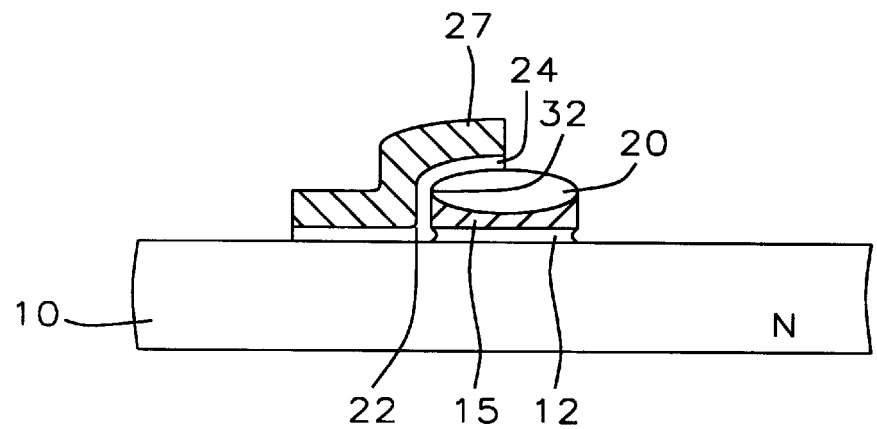
FIG. 8 shows a cross section view of the substrate of FIG. 7 after forming the control gate.

As shown in FIG. 7, a second photoresist mask 28 is then formed on the layer of second polysilicon 26. As shown in FIG. 8, that part of the layer of second polysilicon not covered by the second photoresist mask is etched away using dry anisotropic etching thereby forming a control gate 27. This leaves a gap between the control gate 27 and the sharp edge 32 of the floating gate 15 of between about 100 and 500 Angstroms. The second photoresist mask is then removed. That part of the layer of second oxide not covered by the control gate 27 is then etched away leaving second oxide 24 between the floating gate 15 with the oxide cap 20 and the control gate 27 and between the control gate 27 and that part of the silicon substrate 10 which will become the channel.

Figure 9:
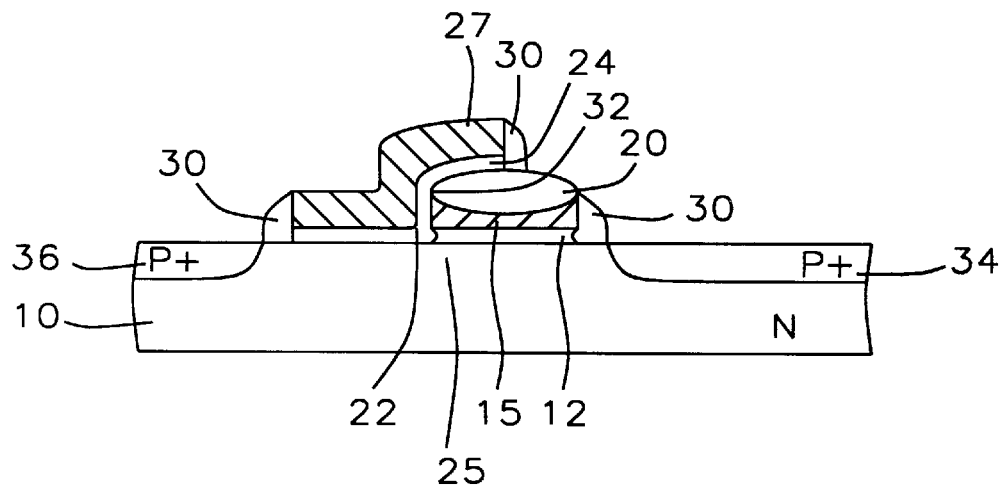
FIG. 9 shows a cross section view of the substrate of FIG. 8 after forming the source and drain.

Next, as shown in FIG. 9, spacers 30 are formed on the edges of the control gate 27 and on those parts of the sidewalls of the floating gate 15 using conventional techniques. Ion implantation is then used with the spacers 30, the control gate 27 and the floating gate 15 as a mask to form $P^+$ type source 36 and drain 34 regions. The source and drain regions define a channel region 25 between the source and drain thereby completing the flash memory cell.

Figure 10:
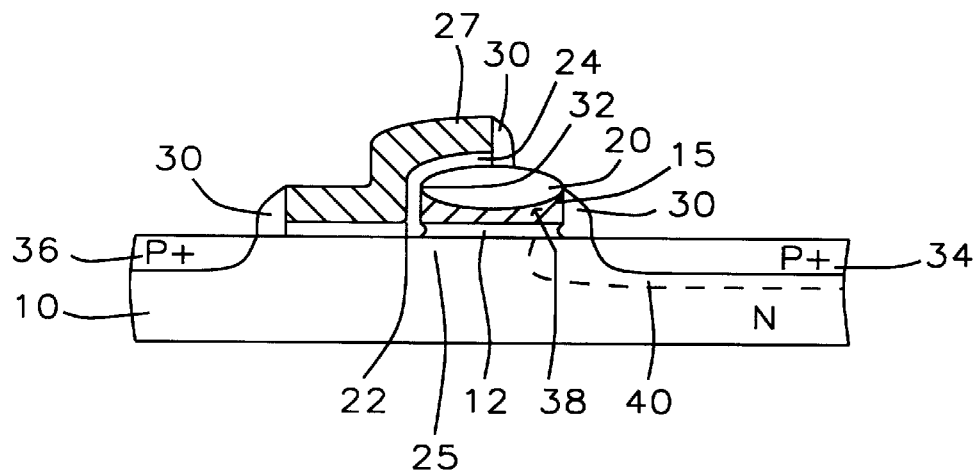
FIG. 10 shows a cross section view of the flash memory cell showing the mechanism of programming the cell.
Figure 11:
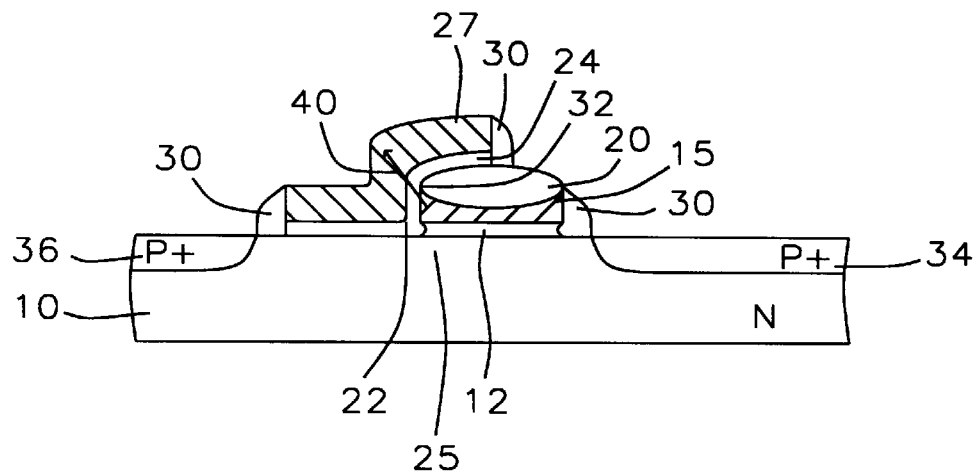
FIG. 11 shows a cross section view of the flash memory cell showing the mechanism of erasing the cell.

Refer now to FIGS. 10 and 11 for the preferred embodiment of the flash memory cell and the method of programming and erasing the flash memory cell. FIGS. 10 and 11 show the flash memory cell having an N type silicon substrate 10, a $P^+$ type source region 36, a $P^+$ type drain region 34, an N type channel region 25, a polysilicon floating gate 15, a first oxide 12 between the floating gate 15 and the channel region 25, an oxide cap 20 on the floating gate, a polysilicon control gate 27, and a second oxide 24 between the control gate 27 and the floating gate 15 and between the control gate 27 and the channel region 25. FIGS. 10 and 11 also show a sharp edge 32, formed by the intersection of the concave top and sidewalls of the floating gate, between the floating gate 15 and the control gate 27. FIGS. 10 and 11 also show the protrusion 22 of the control gate 27 near the channel region 25 and the control gate 15.

As shown in FIG. 10 to program the flash memory cell a voltage of between about −9.0 and −10.0 volts is supplied between the drain 34 and ground potential, a voltage of between about −4.5 and −5.5 volts is supplied between the control gate 27 and ground potential, the source 36 is held at ground potential, and the substrate 10 is held at ground potential. These voltages cause a deep depletion region 40 to form around the drain 34 causing holes to be accelerated from the source to the drain resulting in the formation of hot, or energetic, electrons near the drain which are injected into the floating gate 15 as shown by the arrow 38. This injection of hot electrons into the floating gate 15 charges the floating gate 15 negatively so that if a negative voltage is applied to the control gate 27 current can flow from the source 36 to the drain 34 as the flash memory cell is read. The P-channel flash memory cell programs faster than a comparable N-channel flash memory cell.

The method of erasing the flash memory cell is shown in FIG. 11. To erase the flash memory cell a voltage of between about 10.0 and 12.0 volts is supplied between the control gate 27 and ground potential while holding the source 36, the drain 34, and the substrate 10 at ground potential. The sharp edge 32 on the floating gate 15 causes a high electric field between the sharp edge of the floating gate and the control gate resulting in Fowler-Nordheim tunneling of electrons between the floating gate 15 and the control gate 27, as indicated by the arrow 40. The Fowler-Nordheim tunneling is quantum effect tunneling of electrons in their normal energy state and does not rely on the presence of hot, or energetic, electrons. This tunneling discharges the floating gate and erases the memory cell.

There are some practical advantages of P-channel flash memory cells compared to N-channel flash memory cells. During the programming cycle the P-channel flash memory cell has an impact ionization rate about three times a large as for an N-channel flash memory cell. This results in the creation of more hot, or energetic, electrons for programming the cell. With more hot electrons available the source junction to drain junction distance and the length of the floating gate can be reduced which allows the dimensions of the flash memory cell to be reduced. More hot electrons available also results in faster programming of the P-channel flash memory cell compared to the N-channel flash memory cell. The protrusion 22 in the control gate near the channel region and the floating gate can cause reverse tunneling of electrons from the control gate into the floating gate for an N-channel flash memory cell, but is not a problem for P-channel memory cells because of the voltages used for programming the P-channel flash memory cell are negative voltages. This reverse tunneling often makes nitride spacers necessary for N-channel flash memory cells but nitride spacers are not needed for P-channel flash memory cells.

While the invention has been particularly shown and described with reference to the preferred embodiments thereof, it will be understood by those skilled in the art that various changes in form and details may be made without departing from the spirit and scope of the invention.

What is claimed is:

1. A P-Channel flash memory cell, comprising:
   a substrate, wherein said substrate is N type silicon;
   a source formed in said substrate;
   a drain formed in said substrate;
   a channel region in said substrate wherein said channel region is between said source and said drain;
   a first oxide, having a first thickness, formed on said substrate;
   a floating gate formed on said first oxide, wherein said floating gate is located directly over a part of said channel region, no part of said floating gate is located directly over either said source region or said drain region, said floating gate has a curved top surface which is depressed at the center of said curved top surface, and said floating gate has a sidewall which intersects said curved top surface to form a sharp edge;
   a second oxide formed over said floating gate thereby covering said sharp edge and said sidewall of said floating gate; and
   a control gate formed on said second oxide, wherein no part of said control gate is located directly over either said source region or said drain region, and wherein said control gate covers a part of said floating gate, including said sharp edge of said floating gate, so that the distance between said control gate and said floating gate is a first distance.

2. The P-channel flash memory cell of claim 1 wherein said source is $P^+$ type silicon.

3. The P-channel flash memory cell of claim 1 wherein said drain is $P^+$ type silicon.

4. The P-channel flash memory cell of claim 1 wherein said first thickness is between about 50 and 100 Angstroms.

5. The P-channel flash memory cell of claim 1 wherein said floating gate is polysilicon.

6. The P-channel flash memory cell of claim 1 wherein said control gate is polysilicon.

7. The P-channel flash memory cell of claim 1 wherein said control gate is recrystallized amorphous silicon.

8. The P-channel flash memory cell of claim 1 wherein said first distance is between about 100 and 500 Angstroms.

9. The P-channel flash memory cell of claim 1 wherein said P-channel flash memory cell is programmed by injection of hot electrons from said channel region through said first oxide into said floating gate by means of supplying a voltage of between about −9.0 and −10.0 volts between said drain and ground potential, supplying a voltage of between about −4.5 and −5.5 volts between said control gate and ground potential, holding said source at ground potential, and holding said substrate at ground potential.

10. The P-channel flash memory cell of claim 1 wherein said P-channel flash memory cell is erased by Fowler-Nordheim tunneling of electrons from said sharp edge of said floating gate through said second oxide into said control gate by means of supplying a voltage of between about 10.0 and 12.0 volts between said control gate and ground potential while holding said source, said drain, and said substrate at ground potential.

* * * * *